US010917988B2

(12) United States Patent
Vinokurov et al.

(10) Patent No.: US 10,917,988 B2
(45) Date of Patent: Feb. 9, 2021

(54) MATERIAL REMOVAL FROM INNER SURFACE TO PRESERVE PERCEPTION OF OUTER SURFACE AESTHETICS

(71) Applicant: Lutron Technology Company LLC, Coopersburg, PA (US)

(72) Inventors: Dmitriy Vinokurov, Upper Black Eddy, PA (US); Daniel C. Raneri, Orefield, PA (US); Alexander W. Gage, Havertown, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 77 days.

(21) Appl. No.: 15/826,947

(22) Filed: Nov. 30, 2017

(65) Prior Publication Data

US 2018/0153051 A1 May 31, 2018

Related U.S. Application Data

(60) Provisional application No. 62/428,228, filed on Nov. 30, 2016.

(51) Int. Cl.
| | | |
|---|---|---|
| *H01H 9/16* | (2006.01) | |
| *H05K 5/03* | (2006.01) | |
| *B23K 26/362* | (2014.01) | |
| *G09F 13/00* | (2006.01) | |
| *B44C 5/04* | (2006.01) | |
| *B44C 1/22* | (2006.01) | |
| *B23K 26/361* | (2014.01) | |

(Continued)

(52) U.S. Cl.
CPC ............. *H05K 5/03* (2013.01); *B23K 26/361* (2015.10); *B23K 26/362* (2013.01); *B44C 1/22* (2013.01); *B44C 5/0415* (2013.01); *B44C 5/0446* (2013.01); *G09F 13/00* (2013.01); *H01H 9/16* (2013.01); *H01H 9/161* (2013.01); *H01H 2009/0292* (2013.01); *H05K 5/0017* (2013.01)

(58) Field of Classification Search
CPC .......... H05K 5/03; H01H 9/0264; H01H 9/02
See application file for complete search history.

(56) References Cited

U.S. PATENT DOCUMENTS

| | | | | |
|---|---|---|---|---|
| 1,437,659 | A * | 12/1922 | Jacobi ...................... | H01H 9/02 |
| | | | | 200/43.11 |
| 8,686,287 | B1 * | 4/2014 | Gretz ...................... | H02G 3/123 |
| | | | | 174/50 |
| 9,807,481 | B2 * | 10/2017 | O'Keeffe ............... | H04R 1/023 |

(Continued)

OTHER PUBLICATIONS

Läntzch, Carmina, et al., Challenges for Step Stencils with Design Guidelines for Solder Paste Printing, IPC APEX Expo 2012, 2012, p. 1737, vol. 3.

*Primary Examiner* — Felix O Figueroa
(74) *Attorney, Agent, or Firm* — Glen Farbanish; Philip Smith; Amy Yanek

(57) ABSTRACT

A veneer for a wall-mounted keypad may include indicia that are laser cut therethrough and that are representative of functions that may be performed by the keypad. The veneer may include a recess that extends into an inner surface of the veneer, proximate to the indicia. The recess may be shaped such that a perceived aesthetic of an outer surface of the veneer is preserved during formation of the indicia. The recess may for example have an organic shape defined by a curved outer perimeter that does not define any corners.

17 Claims, 6 Drawing Sheets

(51) Int. Cl.
*H05K 5/00* (2006.01)
*H01H 9/02* (2006.01)

(56) References Cited

U.S. PATENT DOCUMENTS

| | | | |
|---|---|---|---|
| 2006/0027389 A1* | 2/2006 | Xu | H01H 9/02 174/66 |
| 2017/0053753 A1 | 2/2017 | Adams et al. | |
| 2018/0061590 A1* | 3/2018 | Questel | H02G 3/10 |

* cited by examiner

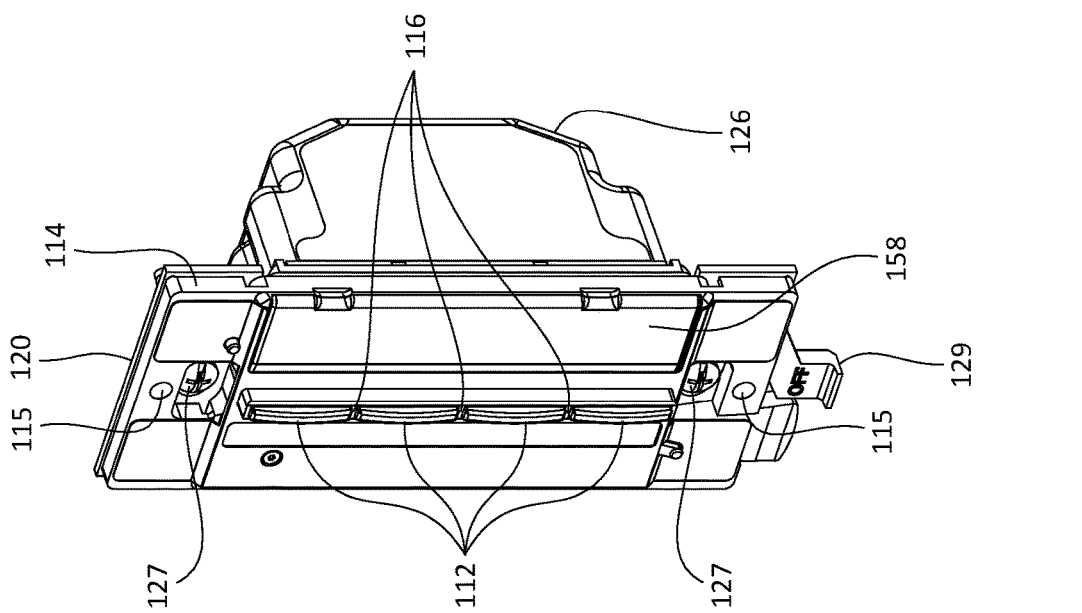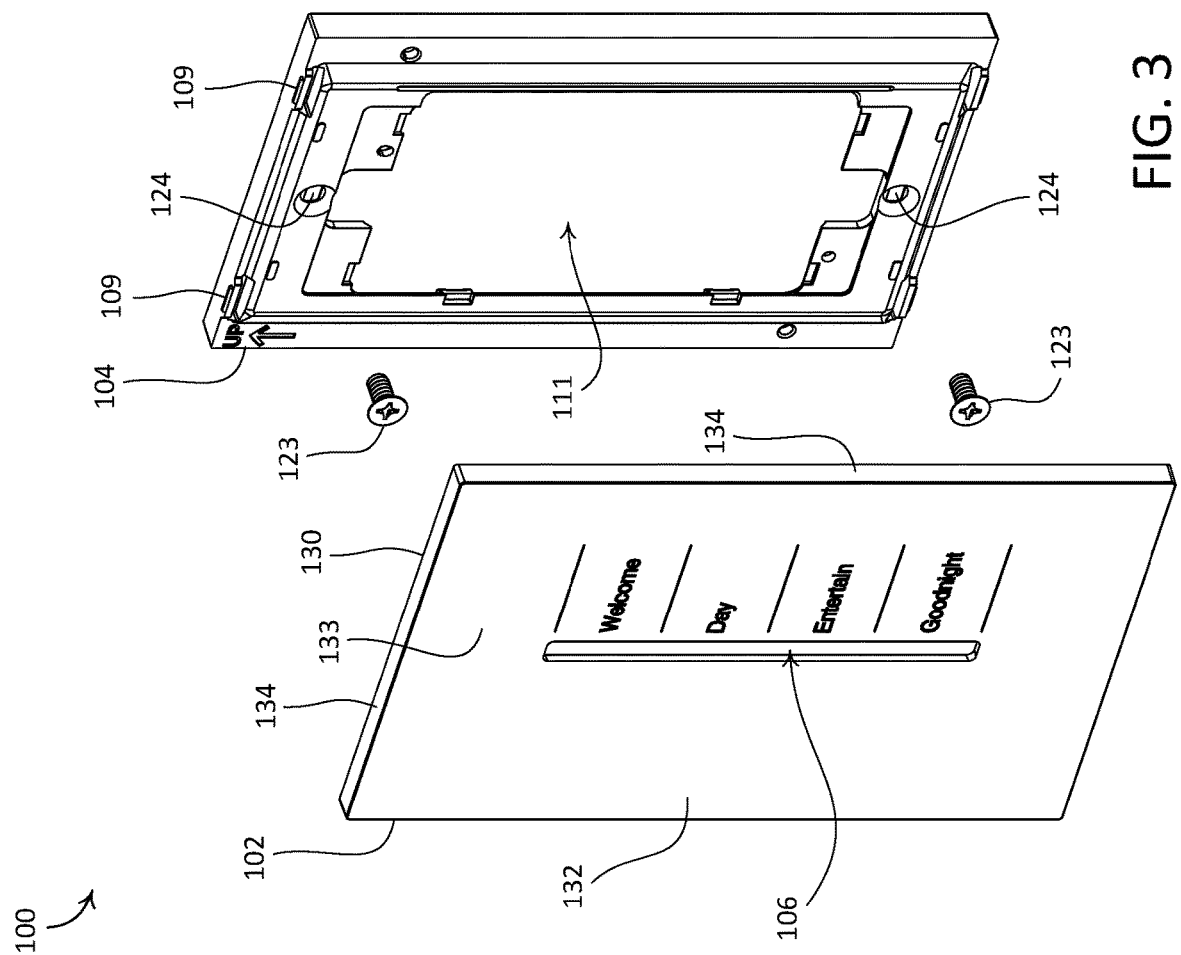
FIG. 3

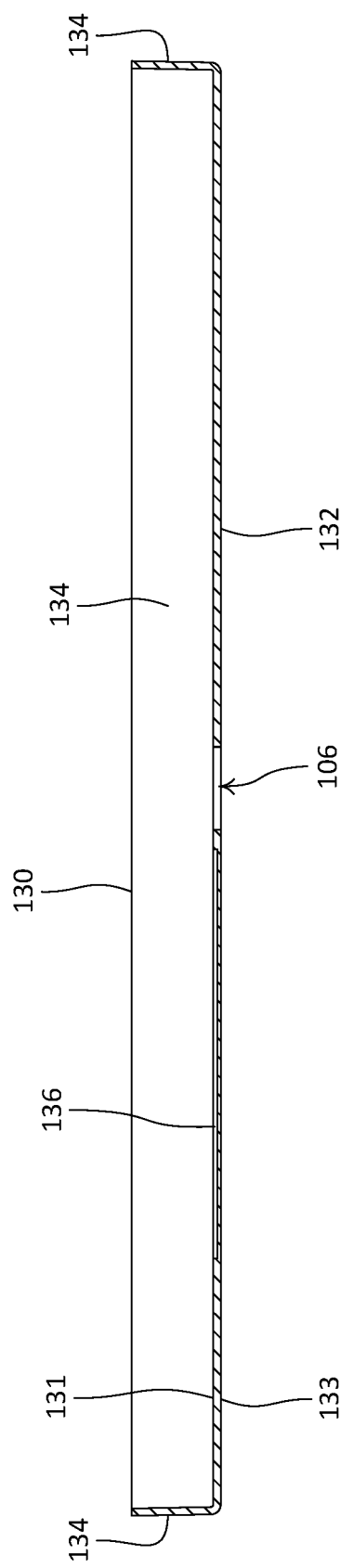
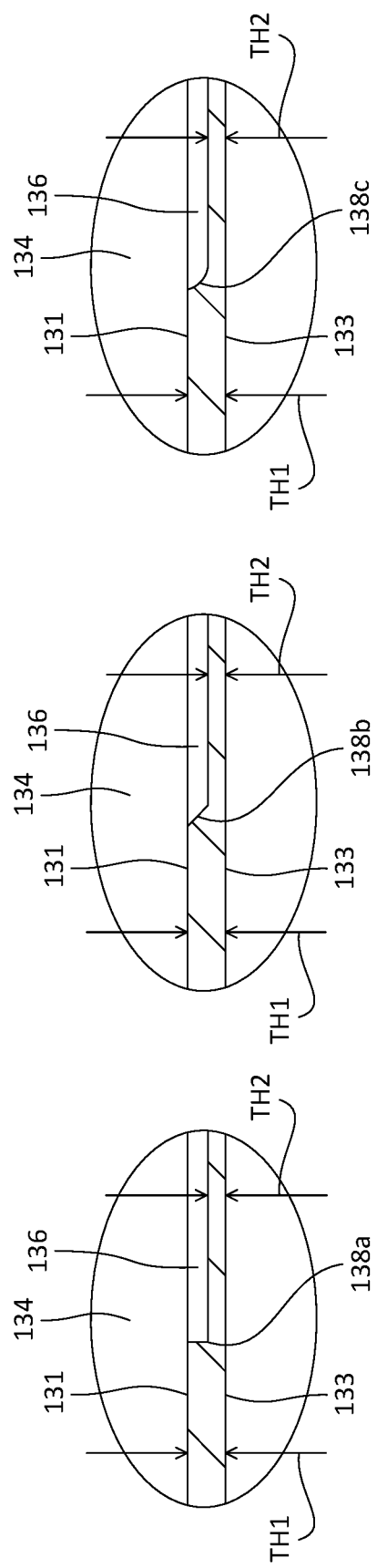

MATERIAL REMOVAL FROM INNER SURFACE TO PRESERVE PERCEPTION OF OUTER SURFACE AESTHETICS

CROSS-REFERENCE TO RELATED APPLICATIONS

This application claims priority to U.S. provisional patent application No. 62/428,228, filed Nov. 30, 2016, which is incorporated herein by reference in its entirety.

BACKGROUND

Load control devices may be used to control the amount of power delivered from a power source, such as an alternating-current (AC) power source, to one or more electrical loads. An example of such a load control device is a wall-mounted dimmer switch. Load control devices may be integrated into home automation systems.

Home automation systems, which have become increasing popular, may be used by homeowners to integrate and/or control multiple electrical and/or electronic devices in their homes. For example, a homeowner may connect devices such as appliances, lights, blinds, thermostats, cable or satellite boxes, security systems, telecommunication systems, and the like to each other via a wireless network.

The homeowner may control such devices using a central (e.g., automated) controller, a dedicated remote control device (e.g., a wall-mounted keypad), a user interface provided via a phone, tablet, computer, or other device that is directly connected to a home network or remotely connected via the Internet, and so on. These devices may communicate with each other and/or with a control device, for example to improve efficiency, convenience, and/or usability of the devices.

Dedicated control devices for load control systems, such as wall-mounted keypads, may be manufactured to be aesthetically pleasing. For example, wall-mounted keypads may include faceplates and buttons made of metal, glass, or other materials to lend the keypads a luxury aesthetic when compared to traditional plastic keypads. Such wall-mounted keypads may include indicia that may be formed on front surfaces of the faceplate and/or buttons, for example, using a laser cutting process through a veneer, such as a metal sheet. However, the manufacture of such keypads may be problematic. For example, a portion of a veneer of a faceplate and/or button may need to be thinned to allow for forming the indicia in the veneer via the laser cutting process. However, thinning a portion of a veneer may cause deformation of an outer surface of the veneer. Such deformation may diminish a perceived aesthetic of a faceplate and/or button to which the veneer is attached.

SUMMARY

As described herein, a faceplate for a remote control device may include a faceplate body and a veneer that is attached to the faceplate body. The remote control device may be configured as a wall-mounted keypad, for example. The keypad may include one or more buttons that extend through an opening in the faceplate. The keypad may include one or more light sources that are configured to illuminate at least a portion of the faceplate from within an interior of the keypad.

The veneer may be made of metal, for example. The veneer may include a plate portion that defines an outer surface and an opposed inner surface. Indicia that are representative of functions that may be performed by the keypad may be defined in the plate portion of the faceplate, for instance adjacent corresponding ones of the buttons. The indicia may be defined using a laser cutting process, for example.

The veneer may include a recess that extends into the inner surface of the plate portion. The recess may be located in an area of the plate portion that includes the indicia. Formation of the recess may allow for the generation of the indicia via the laser cutting process. The recess may be shaped such that a perceived aesthetic of the outer surface of the veneer is preserved during formation of the indicia. The perceived aesthetic may be a smoothness of the outer surface of the faceplate and/or a lack of deformation of the outer surface proximate to the indicia, for example. The recess may for example, have an organic shape defined by a curved outer perimeter that does not define any corners.

BRIEF DESCRIPTION OF THE DRAWINGS

FIG. 3 is a partial exploded view of the example control device illustrated in FIG. 1.

FIG. 5 is a section view of the veneer illustrated in FIG. 4.

FIG. 6A is a zoomed-in view of an example faceplate veneer recess, wherein the recess defines a first example inner edge geometry.

FIG. 6B is a zoomed-in view of another example faceplate veneer recess, wherein the recess defines a second example inner edge geometry.

FIG. 6C is a zoomed-in view of still another example faceplate veneer recess, wherein the recess defines a third example inner edge geometry.

DETAILED DESCRIPTION

Figure 1:
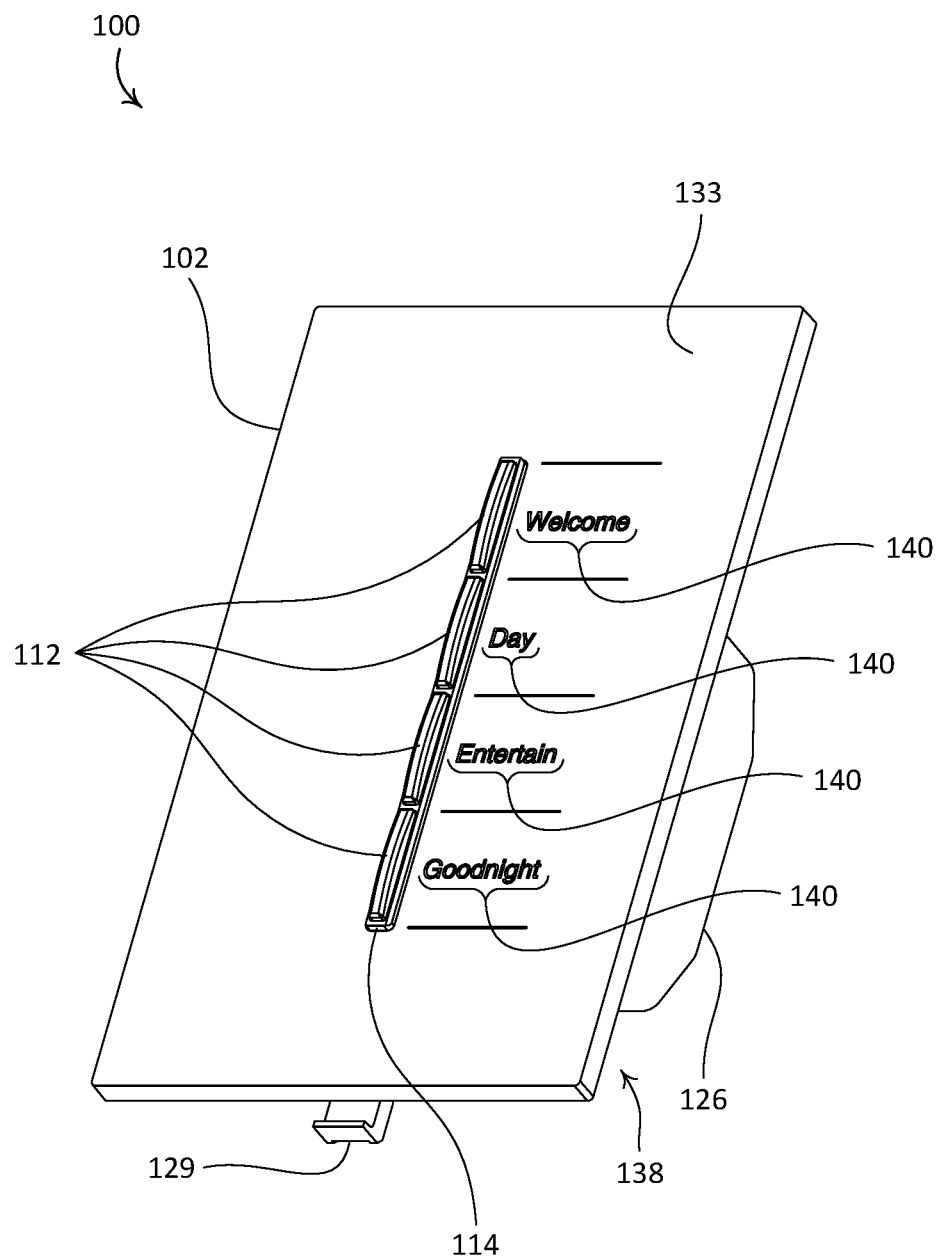
FIG. 1 is a perspective view of an example control device, configured as a wall-mounted keypad.
Figure 2:
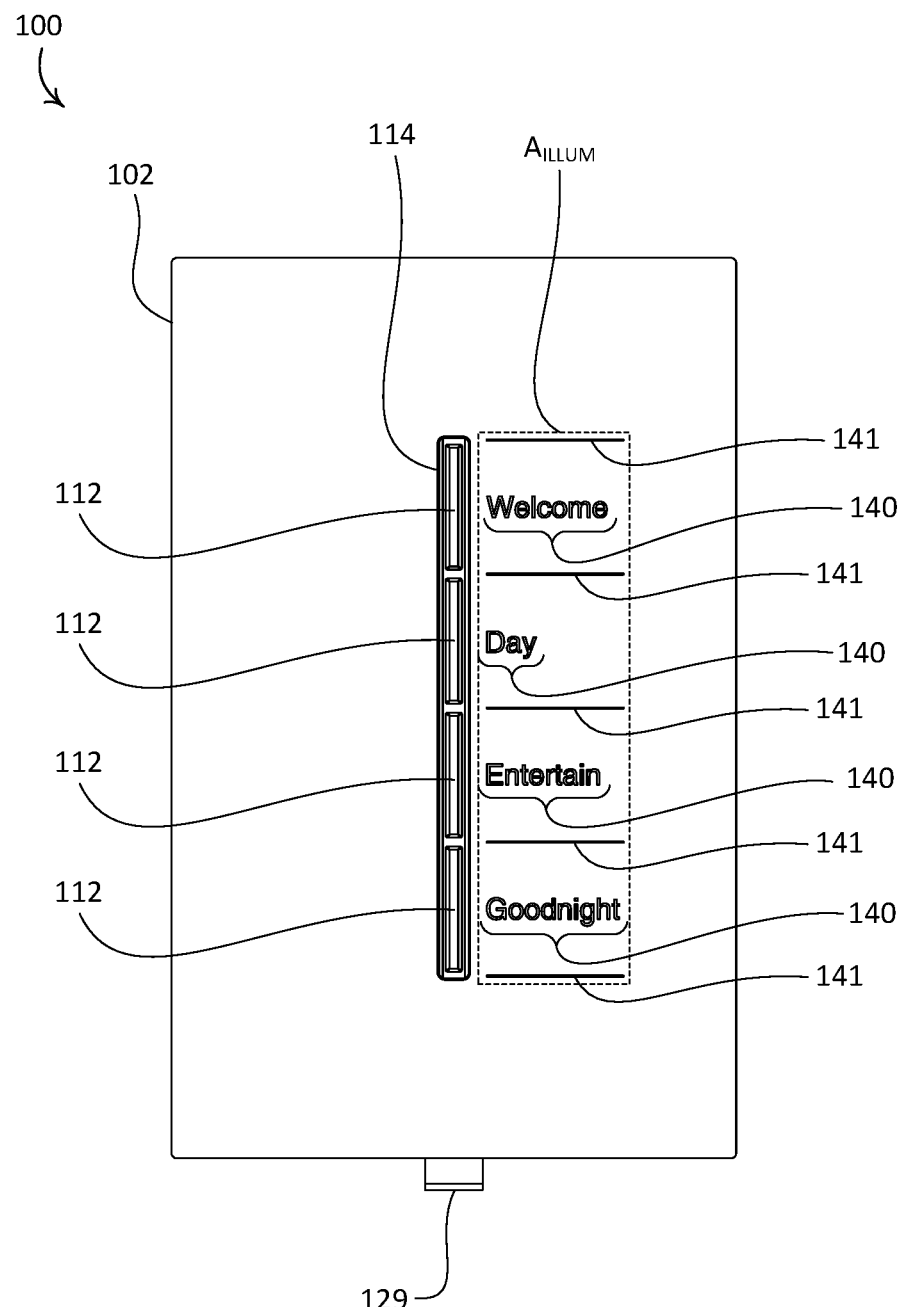
FIG. 2 is a front view of the example control device illustrated in FIG. 1.

FIGS. 1-3 depict an example control device that may be configured for use in a load control system for controlling one or more load control devices and/or electrical loads, such as lighting loads, motorized window treatments, or the like. As shown, the example control device is configured as a wall-mounted keypad 100 that may be configured to operate as a remote control device of a load control system, for example. The keypad 100 may include a faceplate 102, an adapter 104 to which the faceplate 102 may be removably attached, and one or more actuation members, such as buttons 112. The keypad 100 may include a bezel 114 that may be configured to support the one or more buttons 112. As shown, the one or more buttons 112 may be arranged along a longitudinal axis of the keypad 100. The faceplate 102 may define an opening 106 that extends therethrough. As shown, the opening 106 may be configured to at least partially receive a portion of the bezel and portions of the one or more buttons 112, for example when the faceplate 102 is attached to the adapter 104.

The keypad 100 may further include an enclosure 126 that is configured to be mounted to a structure, such as within a wallbox that is installed in an interior wall of a building. The illustrated keypad 100 may be configured to control a load control device, such as a load control device configured to control an amount of power delivered to one or more electrical loads (e.g., one or more lighting loads) from a power source, such as an alternating-current (AC) power source or a direct current (DC) power source.

The faceplate 102 may include a faceplate body (not shown) and a veneer 130 that is attached to a front surface of the faceplate body. The faceplate body may be referred to as a carrier portion, such as a carrier portion of the faceplate 102 or more generally as a carrier portion of the keypad 100. The veneer 130 of the faceplate 102 may include a plate portion 132 and peripheral walls 134 that extend around a perimeter of the veneer 130. The plate portion 132 may define an outward-facing outer surface 133 and an opposed, inward-facing inner surface 131. The outer surface 133 may be referred to as a front surface of the veneer 130, and more generally as a front surface of the faceplate 102. As shown, the plate portion 132 may define a flat, substantially planar outer surface 133. The veneer 130 may be made of any suitable material, such as metal. The veneer 130 may be made of sheet metal, for example, and may be formed by an embossing process, a progressive stamping process, or the like. Alternatively, the veneer may be made of other materials, such as, for example, plastic materials.

The plate portion 132 and peripheral walls 134 of the veneer 130 may define a cavity 138 that extends into a rear of the veneer 130. The faceplate body may be configured to be received in the cavity 138. The veneer 130 may be secured to the faceplate body using an adhesive, for example. It should be appreciated that the veneer 130 may be otherwise secured to the faceplate body, for example via mechanical attachment, such as tabs, snap locks, fasteners, or the like.

The veneer 130 may have one or more finishes applied thereto. Example finishes for the veneer 130 may include satin nickel, antique brass, bright chrome, stainless steel, gold, or clear anodized aluminum for example. It should be appreciated that the faceplate 102 is not limited to the illustrated configuration. For example, instead of being disposed onto a faceplate body, the faceplate 102 may be monolithic, for instance made entirely of metal.

The veneer 130 may include one or more indicia, such as indicia 140 that are defined therein. In accordance with the faceplate 102 of the illustrated keypad 100, the indicia 140 may be words that are indicative of respective functions that may be performed by the keypad 100, and that may be invoked by depressing the buttons 112. The indicia 140 may be laser cut through the veneer 130. For example, the indicia 140 may be formed during a laser cutting process. As shown, the indicia 140 may extend into the outer surface 133 of the veneer 130 and through the veneer 130.

The illustrated indicia 140 include letters that form respective words. However, the indicia 140 are not limited to letters, and may include any combination of alphanumeric characters, icons (e.g., symbols), or the like. As shown, one or more of the indicia 140 may be underlined by perforations, such as slots 141 that extend through the faceplate 102. The indicia 140 may be representative of a command for controlling an electrical load. For example, the indicia 140 may be representative of: a command message that may be transmitted by the keypad 100; of a command that is executed internally by the keypad 100; of a result of the performance of a command; or the like.

To illustrate, the indicia 140 may be representative of predetermined scenes that correspond to respective lighting intensities of one or more lighting loads that are controlled by the keypad 100. One or more command messages to invoke a corresponding scene may be transmitted by the keypad 100 in response to one or more actuations of the buttons 112, for example. For example, the keypad 100 may be operable to control the intensity of a controlled lighting load in response to actuations of the buttons 112. The one or more buttons 112 may be made of a non-conductive material, such as plastic or glass, or of a conductive material, such as a metallic sheet attached to a plastic carrier.

Respective ones of the indicia 140 may correspond to particular ones of the one or more buttons 112. Each button 112 may be designated to actuate one or more operational settings (e.g., presets, scenes, and/or predetermined light intensities) associated with a specific use scenario, such as "Welcome," "Day," "Entertain," or "Goodnight." An operational setting may refer to predetermined and/or configurable operational parameters of one or more electrical loads, for example, light intensity, HVAC setting (e.g., temperature), window treatment setting, and/or the like. The specific use scenario associated with each of the buttons 112 may be indicated, for example, by corresponding indicia 140 located next to the buttons 112 describing their associated use scenarios, such as "Welcome," "Day," "Entertain," or "Goodnight." The keypad 100 may be configured to transmit RF signals in response to actuations of the buttons 112 to apply the corresponding operational settings.

The bezel 114 may be define one or more discrete openings that are separated by one or more dividers 116, through which respective front surfaces of the one or more buttons 112 may extend. The keypad 100 may include a yoke 120. The yoke 120 may be used to mount the keypad 100 to a standard electrical wallbox, for example, via mounting screws 127 that may be received through corresponding mounting holes (not shown) in the yoke 120. The yoke 120 may be made from a conductive material, such as metal.

The adapter 104 may be configured to allowable releasable attachment of the faceplate 102 to the adapter 104. The adapter 104 may define an opening 111 that extends therethrough. The opening 111 may be configured to receive at least a portion of the bezel 114 therein when the faceplate 102 is attached to the adapter 104. The faceplate 102 may include one or more attachment members that may be configured to releasably attach to complementary attachment members of the adapter 104. For example, the adapter 104 may define one or more tabs 109 that protrude from outer walls of the adapter 104, the tabs 109 configured to engage with complementary attachment features, such as corresponding resilient snap-fit connectors (now shown) of the faceplate 102. The illustrated adapter 104 may include two tabs 109 that protrude from an upper surface of the adapter 104, and two tabs (not shown) that protrude from an opposed lower surface of the adapter 104. The adapter 104 may be configured to be mounted to the yoke 120, for example using faceplate screws 123 that may be received through openings 124 defined by the adapter 104 that extend therethrough, openings 115 defined by the bezel 114, and corresponding openings (not shown) defined by the yoke 120.

The enclosure 126 may house one or more electrical components of the keypad 100, such as one or more printed circuit boards. The keypad 100 may include an air-gap actuator 129, which may be configured to actuate an internal air-gap switch inside of the enclosure 126 through an opening (not shown) in the yoke 120. The air-gap switch actuator 129 may be configured to translate along the longitudinal axis of the keypad 100 to open and close the internal air-gap switch.

The faceplate body may be made of a translucent material, for instance white or clear plastic, such that when the faceplate body is backlit, light may pass through the faceplate body and reach an inner surface of the veneer 130, for example in a location proximate the indicia 140. Such light may be emitted, for example, from the interior of the keypad 100. In accordance with such an implementation, the indicia 140 of the veneer 130 may expose corresponding underlying surfaces of the faceplate body, such that the indicia 140 may be illuminated when the faceplate body is backlit. The keypad 100 may comprise one or more light sources (not shown) that may illuminate the faceplate from within an interior of the keypad 100. The keypad 100 may include a light-guiding component 158 (e.g., a light-pipe) that may be configured to control the transmission of light from the one or more light sources.

The one or more light sources may include, for example, one or more LEDs and/or one or more LED strips. The number of the side-firing LED devices may vary and may not necessarily be related to the number of indicia 140 defined in the faceplate 102. The one or more light sources may produce light of a single color or multiple colors. The light-guiding component 158 may be configured to direct light transmitted from the one or more light sources onto a target illumination area of the faceplate 102. Such a target illumination area may comprise, for example, an area $A_{ILLUM}$ of the faceplate 102 that includes indicia 140 that indicate the various use scenarios associated with the buttons 112. The one or more light sources and the light-guiding component 158 may operate to illuminate the target illumination area $A_{ILLUM}$ uniformly or non-uniformly. As shown, the target illumination area $A_{ILLUM}$ comprises a rectangular area that extends slightly beyond the indicia 140 and slots 141. However, it should be appreciated that the keypad 100 is not limited to the respective illustrated geometries of the light-guiding component 158 and target illumination area.

With reference now to FIGS. 4, 5, and 6A-6C, in an example implementation of the faceplate 102 the veneer 130 may be formed from a sheet of metal, such as steel, having a thickness TH1 of approximately 0.016 inches. This thickness of sheet metal may allow the peripheral walls 134 to be formed, for example using a stamping process. The indicia 140 may be laser cut into the veneer 130, for example through the plate portion 132 as shown. The alphanumeric characters of the illustrated indicia 140 may be narrow, for example approximately 0.004 inches.

In order to minimize the occurrence of splatter deposition (e.g., plunge splatter) on the outer surface 133 of the veneer 130 during cutting of the indicia 140 via a laser cutting process, a portion of material may be removed from the inner surface 131 of the veneer 130. Mitigating the occurrence of splatter deposition may preserve the aesthetic of the veneer 130. For example, as shown, a recess 136 may be defined that extends into the inner surface 131 of the plate portion 132 of the veneer 130. The recess 136 may be formed such that the plate portion 132 is locally thinned to a thickness that is thinner than TH1, such that the laser can plunge through the plate portion 132 without causing molten metal to deposit on the outer surface 133 of the veneer 130. For example, the recess 136 may be defined by removing material from the inner surface 131 such that the plate portion 132 is locally thinned to a thickness TH2 of approximately 0.008 inches.

Figure 4:
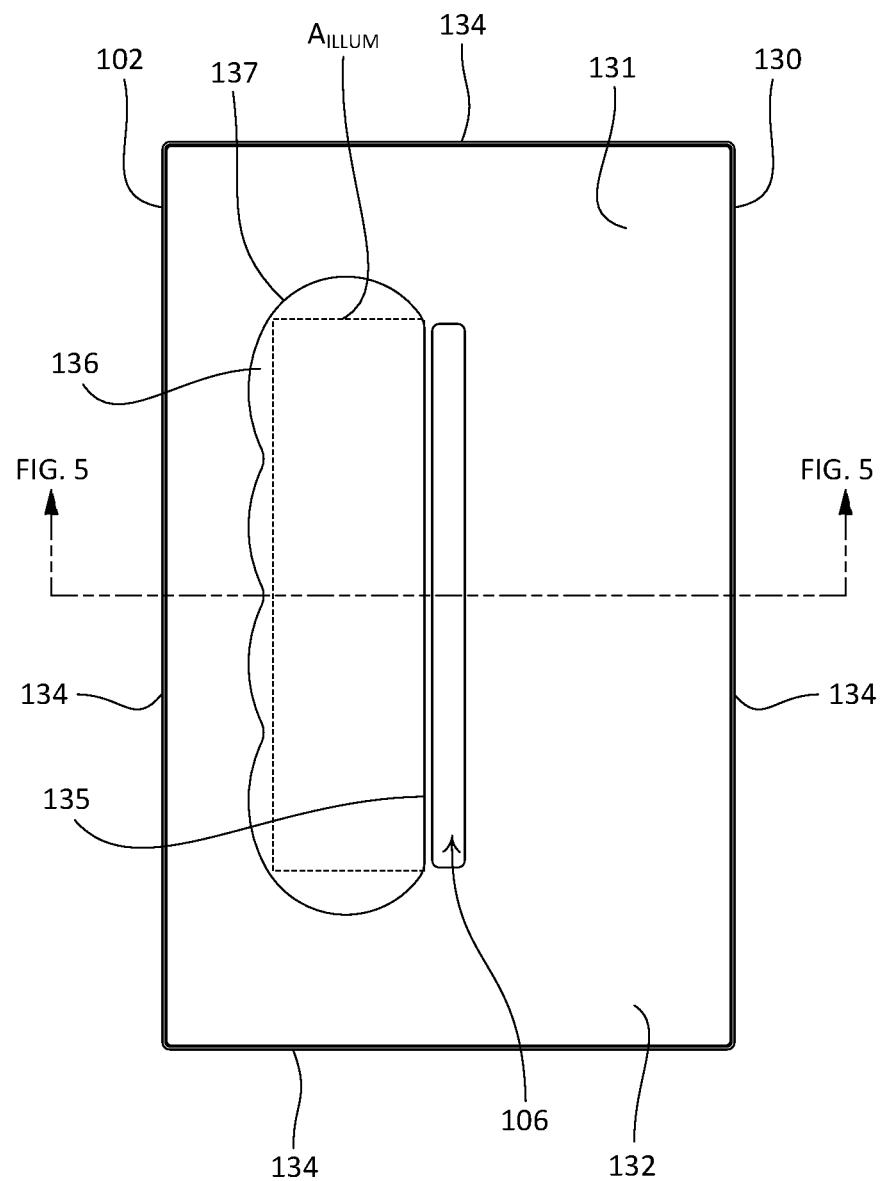
FIG. 4 is a rear view of a veneer component of a faceplate of the example control device illustrated in FIG. 1.

The recess 136 may be located proximate to the indicia 140. For example, as shown in FIG. 4, the recess 136 may be sized to surround the target illumination area $A_{ILLUM}$. After formation of the recess 136, the outer surface 133 of the veneer 130 may exhibit minor deformation proximate to the location of the recess 136. The formation of the recess 136 may act to relieve internal stresses in the material around the inner surface of the recess 136, thereby causing a slight deformation or bowing of the material around the recess 136. The slight deformation in the area of the recess may be apparent to a user viewing the outer surface 133 of the veneer 130 for veneers of sufficiently thin material. This deformation has been observed for metal veneers having a total thickness of less than 0.02 inches with a recess thickness equal to or greater than 47 percent of the total thickness of the veneer, but it is contemplated such deformation may also be perceptible to a user for veneers of thicker material and a similar percentage of recess thickness.

The recess 136 may be shaped such that the appearance of any deformation of the outer surface 133 is minimized. In this regard, the recess 136 may be shaped such that a perceived aesthetic of the outer surface 133 of the veneer 130, such as the smoothness of the outer surface 133 and/or a lack of deformation of the outer surface 133 proximate to the indicia 140, is preserved during formation of the indicia 140, for instance during a laser cutting process. For example, as shown in FIG. 4, the recess 136 may define a substantially straight outer perimeter portion 135 that extends parallel to the opening 106 and a curved outer perimeter portion 137. The transitions from the straight outer perimeter portion 135 to the curved outer perimeter portion 137 may also be curved, such that the outer perimeter of the recess 136 does not define any corners. In this regard, the recess 136 defines an organic shaped outer perimeter. It should be appreciated that the outer perimeter of the recess 136 is not limited to the illustrated geometry, and that other organic geometries may be implemented.

If formation of the recess 136 causes deformation on the outer surface 133 of the veneer 130, the curved outer perimeter shape of the recess, along with the lack of corners, may present an optical illusion to a user of the keypad 100 such that the deformation is visually less noticeable, for instance compared to deformation that includes straight lines and/or sharp corners.

Figure 6E:
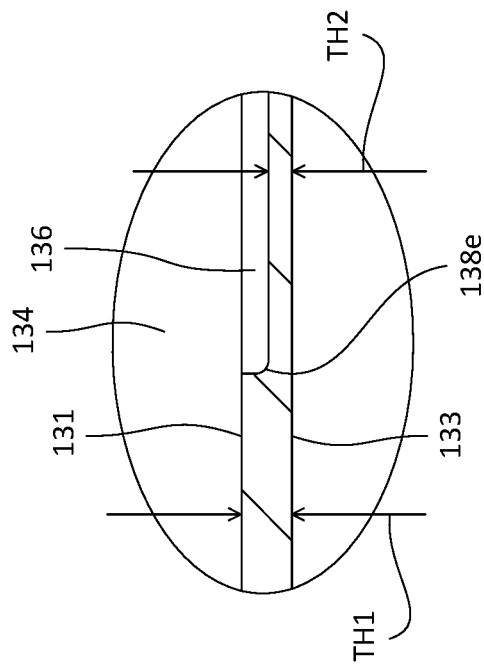
FIG. 6E is a zoomed-in view of another example faceplate veneer recess, wherein the recess defines a fifth example inner edge geometry.
Figure 6D:
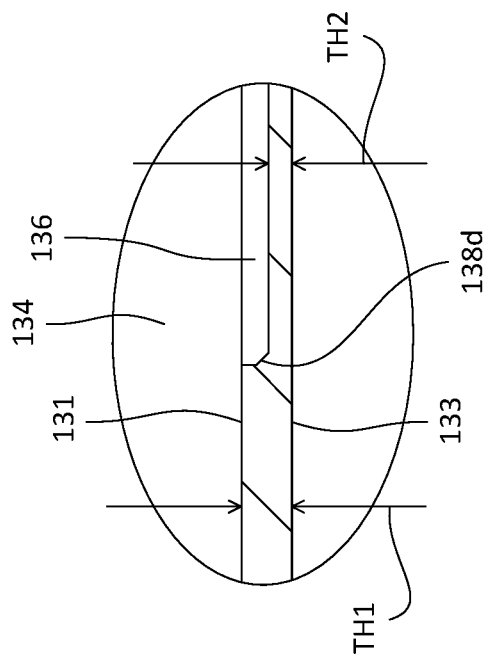
FIG. 6D is a zoomed-in view of another example faceplate veneer recess, wherein the recess defines a fourth example inner edge geometry.

The illustrated recess 136 may be formed by performing a chemical etching process (or photoetching process) to remove material from the inner surface 131 of the plate portion 132 of the veneer 130. The chemical etching process may be performed as a stepped etching process, for example. The geometry of respective inner edges of the recess 136 (e.g., where peripheral surfaces and a bottom surface of the recess 136 meet) may be controlled during the stepped etching process. For example, the stepped etching process may be performed such that the recess 136 is defined with sharp inner edges 138a, as shown in FIG. 6A. In another example, the stepped etching process may be performed such that the recess 136 is defined with chamfered inner edges 138b, as shown in FIG. 6B. In still another example, the stepped etching process may be performed such that the recess 136 is defined with rounded inner edges 138c, as shown in FIG. 6C. As shown, the inner edges 138b may be referred to as fully chamfered inner edges and the inner edges 138c may be referred to as fully rounded inner edges. In still another example, the stepped etching process may be performed such that the recess 136 is defined with chamfered inner edges 138d, as shown in FIG. 6D. In still another example, the stepped etching process may be performed such that the recess 136 is defined with rounded inner edges 138e, as shown in FIG. 6E. As shown, the inner edges 138d may be referred to as partially chamfered inner edges, and the inner edges 138e may be referred to as partially rounded inner edges. Forming the recess 136 with chamfered inner edges (e.g., inner edges 138b or 138d) or rounded inner edges (e.g., inner edges 138c or 138e) may reduce the introduction of deformation on the outer surface 133 of the veneer 130.

It should be appreciated that the inner edges of the recess 136 are not limited to the illustrated geometries. For example, the inner edges of the recess 136 may alternatively be defined using any size of chamfers, rounds, or the like in any combination. Furthermore, the features defined by the inner edges, such as chamfers or rounds, may have a substantially constant or varying size around respective portions of the perimeter of the recess 136.

It should further be appreciated that formation of the recess 136 is not limited to a chemical etching process. For example, the recess 136 may alternatively be formed using a mechanical process. After formation of the recess 136, post-processing may be performed on the veneer 130, for example by heat treating the veneer 130. Such post-processing may relax deformation of the outer surface 133 of the veneer 130 introduced during formation of the recess 136, thereby mitigating the visibility of the deformation.

Metal veneers may have an internal grain structure that may formed by rolling or working of the metal veneer. For example, as a metal sheet is compressed through rollers, the internal grain structure of the metal may be realigned parallel with the rolling direction. It should be noted that the grain structure referred to herein is distinct from an aesthetic or surface graining. The visibility of the deformation may further be minimized for metal veneers based on the grain orientation with respect to the material removal of the recess. A grain orientation that is parallel, i.e., longitudinal, with the longest axis of the recess may have the least visibility of the deformation. For example, for a veneer as shown in FIG. 4, a grain orientation in the vertical direction (that is, along the length of the opening 106) may have a reduced visibility of the deformation.

An example process for manufacturing the veneer 130 while preserving a perceived aesthetic of the outer surface 133 of the veneer 130 during formation of the indicia 140, may include cutting the opening 106 through a sheet metal blank and cutting the faceplate 102 from the blank, for example using a laser cutting process. The veneer 130 may then be formed from the blank, thereby defining the plate portion 132 and the peripheral walls 134 of the veneer 130, for example using a stamping process. The example process may then proceed to plating the veneer 130. The example process may then proceed to formation of the recess 136 in the inner surface 131 of the plate portion 132, for instance using a stepped chemical etching process. The example process may then proceed to cutting the indicia 140 and/or slots 141 into the plate portion 132, for example using a laser cutting process. It should be appreciated that example process is not limited to the described number or order of steps. For example, one or more steps of the example process may be omitted or performed in a different order.

It should further still be appreciated that the example material removal process and process for manufacturing the veneer is not limited to application to the veneer of a faceplate of a control device for use in a load control system, as illustrated and described herein. The methods described herein may be applicable to any monolithic surface which may exhibit aesthetic deformation on an outer surface due to material removal from an inner surface, and is not limited to faceplates, metal veneers, or even surfaces with indicia. The example material removal process may be adapted for application to other components of the remote control device, for example to define a recess in the inner surface of a veneer for a button of the remote control device. Additionally, the example material removal process may be adapted for application to a monolithic component of a control device (e.g., a load control system remote control device), such as to a solid metal faceplate that does not include a veneer, or a plastic faceplate. Moreover, the example material removal process may be adapted for application to components of other types of control devices (e.g., dimmer switches) and/or to other electrical devices. For example, it is contemplated that the methods described herein may be applicable for use in housings for cellular phones, laptops, or other electronic devices.

The invention claimed is:

1. A control device for controlling an amount of power to one or more electrical loads, the control device comprising:
   an enclosure configured to be mounted to a wallbox;
   a bezel comprising at least one button configured to receive actuations for controlling the one or more electrical loads; and
   a faceplate configured to substantially cover the bezel, the faceplate having a planar material comprising:
      an outer surface comprising an outer perimeter having four linear sides; and
      an inner surface parallel to and opposed to the outer surface, the inner surface comprising a recessed portion having a curved perimeter, wherein the recessed portion extends from the inner surface towards the outer surface;
      an indicium on the outer surface in an area of the recessed portion, wherein the indicium comprises an alphanumeric character or icon that is representative of a function performed by the control device when the at least one button is actuated; and
      an opening proximate to the indicium which extends through the planar material, wherein the opening receives the at least one button of the bezel, such that the at least one button extends through the opening and is accessible from the outer surface;
      wherein the curved perimeter lies in a plane of the inner surface and comprises a portion which extends along a length of one of the linear sides of the outer perimeter; and
      wherein the portion of the curved perimeter comprises a concave curve and a convex curve with respect to the one of the linear sides of the outer perimeter.

2. The control device of claim 1, wherein the planar material is a metal veneer attached to the faceplate of the for a control device.

3. The control device of claim 2, wherein the indicium is cut through the planar material.

4. The control device of claim 3, wherein the curved perimeter of the recessed portion does not define any corners.

5. The control device of claim 3, wherein the curved perimeter of the recessed portion is shaped to preserve a smoothness of the outer surface.

6. The control device of claim 3, wherein the curved perimeter of the recessed portion is shaped to reduce a visible deformation of the outer surface proximate to the indicium.

7. The control device of claim 3, wherein the indicium is cut through the planar material via a laser cutting process.

8. The control device of claim 3, wherein the metal veneer comprises a thickness of less than 0.02 inches.

9. The control device of claim 3, wherein the metal veneer has a grain structure that is longitudinal with a longest axis of the recessed portion.

10. The control device of claim 3, wherein an area of the recessed portion enclosed by the curved perimeter comprises less than half of an area of the inner surface.

11. The control device of claim 3, wherein the planar material is attached to a carrier of the control device.

12. The planar material control device of claim 2, wherein the metal veneer comprises a thickness of less than 0.02 inches.

13. The control device of claim 12, wherein the recessed portion extends from the inner surface towards the outer surface by at least forty seven percent of the thickness of the metal veneer.

14. The control device of claim 13, wherein the curved perimeter of the recessed portion reduces a visible deformation of the outer surface due to the recessed portion of the inner surface.

15. The control device of claim 2, wherein the recessed portion is formed through an etching process.

16. The control device of claim 15, wherein the recessed portion is formed through a stepped etching process.

17. The control device of claim 2, wherein the metal veneer has a grain structure that is longitudinal with a longest axis of the recessed portion.

\* \* \* \* \*